(12) United States Patent
Chacon et al.

(10) Patent No.: US 6,207,468 B1
(45) Date of Patent: Mar. 27, 2001

(54) NON-CONTACT METHOD FOR MONITORING AND CONTROLLING PLASMA CHARGING DAMAGE IN A SEMICONDUCTOR DEVICE

(75) Inventors: Carlos M. Chacon; Pradip K. Roy, both of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/178,317

(22) Filed: Oct. 23, 1998

(51) Int. Cl.[7] .......................... H01L 21/66; G01R 31/26
(52) U.S. Cl. ......................... 438/17; 324/752; 324/765
(58) Field of Search ..................... 324/765, 455, 324/767, 769, 752; 438/305, 307, 308, 770, 768, 14, 17, 18

(56) References Cited

U.S. PATENT DOCUMENTS

| | | | |
|---|---|---|---|
| 5,219,774 | * 6/1993 | Vasche' | 437/43 |
| 5,254,482 | * 10/1993 | Fisch | 437/8 |
| 5,444,637 | * 8/1995 | Smesney | 364/556 |
| 5,462,898 | * 10/1995 | Chen et al. | 437/235 |
| 5,519,334 | * 5/1996 | Dawson | 324/765 |
| 5,851,892 | * 12/1998 | Lojek et al. | 438/305 |
| 6,011,404 | * 1/2000 | Ma et al. | 324/756 |
| 6,037,797 | * 3/2000 | Lagowski et al. | 324/766 |

OTHER PUBLICATIONS

P.K. Roy, C. Chacon, Y. Ma, I.C. Kizilyalli, G.S. Horner, R.L. Verkuil, T.G. Miller; "Non Contact Charecterization of Ultra Thin Dielectrics for the Gigabit Era" Electromechanical Society Proceedings—vol. 97–12; pp. 280–289.*

S. Wolf "Silicon Processing for the VLSI Era Volumnes 2 and 3" copyright 1995 Lattice Press.*

P.K. Roy, C. Chacon, Y. Ma, I.C. Kizilyalli, G.S. Horner, R. L. Verkuil, T.G. Miller; "Non–Contact Characterization of Ultra Thin Dielectrics for the Gigabit Era"; Electrochemical Society Proceedings—vol. 97–12; pp. 280–289.

P.K. Roy, C. Chacon, Y. Ma and G.S. Horner; "In–Line Charge–Trapping Characterization of Dielectrics for Sub–0.5 $\mu$m CMOS Technologies"; Oct. 1–2, 1997; SPIE vol. 3215; pp. 70–83.

* cited by examiner

*Primary Examiner*—Mary Wilczewski
*Assistant Examiner*—David Goodwin

(57) ABSTRACT

The present invention provides a method for controlling a process parameter for fabricating a semiconductor wafer. In one embodiment, the method includes forming a test substrate using a given process parameter, determining a flatband voltage of the test substrate, and modifying the given process parameter to cause the flatband voltage to approach zero. The process parameter that is modified to cause the flatband voltage to approach zero may vary. The flatband may be determined by a non-contact method, which uses a kelvin probe to measure the flatband voltage and a corona source to deposit a charge on the test substrate.

3 Claims, 3 Drawing Sheets

NON-CONTACT METHOD FOR MONITORING AND CONTROLLING PLASMA CHARGING DAMAGE IN A SEMICONDUCTOR DEVICE

TECHNICAL FIELD OF THE INVENTION

The present invention is directed in general to a process for fabricating a semiconductor device, and more specifically to a process for measuring and controlling plasma charging damage in semiconductor devices.

BACKGROUND OF THE INVENTION

Plasma processing has become an integral part of the fabrication of integrated circuits since it offers advantages in terms of directionality, low temperature and process convenience. However, plasma processing also offers increased damage potential because of surface charging of floating gates in MOS devices. With the continued increase in gate oxide thickness to improve device performance, this type of damage is becoming more of a concern. The damage can degrade all of the electrical properties of a gate oxide, which include the fixed oxide charge density, the interface state density, the flatband voltage, the leakage current and the various breakdown related parameters.

Evidence is mounting that the primary cause of oxide damage during plasma etching is charge buildup on the conductors. Plasma nonuniformity across the wafer surface plays a major role in this damage. For example, plasma nonuniformity produces electron and ion currents that do not balance locally and can generate oxide damage. These plasma inconsistencies are caused by hardware (e.g., poor electrode design, nonuniform and/or time-varying magnetic fields) or by a poor choice of process conditions (e.g., use of highly electronegative gas, choosing flows and pressures that lead to unstable plasmas). Additional causes include transient surge currents produced by gas chemistry changes at endpoint and changes in plasma exciting power or coupling capacitor discharges. Etch rate uniformity does not necessarily correlate with plasma uniformity or oxide damage. For instance, a pure $Cl_2$ plasma caused less damage than a plasma containing a mixture of $Cl_2$ and $SF_6$ even though the pure $Cl_2$ plasma produced about twice the etch rate nonuniformity as the plasma with a $Cl_2/SF_6$ mixture.

There are three main current components at the surface of a wafer placed in an RF plasma. While at 13.56 MHZ, the largest is the RF displacement current; this is usually of secondary importance in surface charging because of the low impedance presented by the oxide. Next, there is positive ion flux that is responsible for anisotropic etching. The flux average is nearly constant with time and depends linearly on the local plasma density. The final component, electron flux, flows briefly in every RF cycle to balance the ions lost from the central plasma region. In a uniform plasma, the ion and electron conduction currents locally balance each other over the RF conduction cycle. Charging is not a problem and the surface potential stays close to that of the substrate.

The situation for a nonuniform plasma differs significantly. Ion and electron currents do not have to balance locally through the RF cycle, although there is a net balance over the electrode as a whole. For example, the electron current can be higher than ion current where the plasma potential is at a minimum; where the potential is a maximum, the opposite is true. Also, where excess ion current occurs, the imbalance (e.g., net current flux to the wafer) causes wafer surface charging and results in increased voltage across the gate and decreased voltage across the sheath. The charge buildup continues until the currents balance or the oxide begins to conduct. This feedback mechanism is caused by the exponential dependence of electron current on sheath voltage.

The VLSI industry is focusing on solutions to process-induced plasma damage in product devices. Such damage is caused by cumulative net charge deposition on wafers during plasma processing, where unbalanced plasma charges up the gate dielectric to a level exceeding the dielectric breakdown field. Because of the charge collected by the long conductive gate polysilicon chain in VLSI devices, a seemingly low plasma charging can become multiplied by a ratio factor when discharging through the gate insulator. The ratio factor, called the antenna ratio, is the gate poly area to gate dielectric area.

For the 0.25–0.35 micrometer feature devices, the circuit poly antenna ratio can range from 5:1 to 50:1. The implication is that with a floating gate poly, the case of most in-process product devices prior to first metal, the device gate oxide can experience electrical breakdown during plasma charging more easily than one without, by five to 50 times. Because there is no breakdown current limiter, such dielectric zapping is destructive, leading to device poly to substrate leakage, and device yield is degraded. In the case where the plasma charging buildup may not yet reach the breakdown but goes beyond half the breakdown, the tunneling current is sufficient to damage the oxide-silicon electronic structure that introduces excessive interface states if not properly annealed. Devices with interface damage drift with time. Thus the device reliability is at stake.

Plasma-induced charging damage characterization using test structures requires fast-turn-around between a questionably plasma step and electrical testing to be most useful. MOS capacitor structures provide cheaper and faster fabrication than transistors and also can be pretested to insure their calibration. The C-V measurement is regarded as one of the most sensitive techniques for plasma damage in many cases. However, C-V measurements are slow, sensitive to noise and difficult to automate. Charge-to breakdown $Q_{bd}$ is another option, but it requires long times to breakdown at low gate currents. Accelerated $Q_{bd}$ measurements use larger injecting currents but lowers this measurement sensitivity. Recently, a new voltage time (V-t) method was proposed which uses low constant current stressing and measures the biased voltage change with time (dV/dt). It was found that dV/dt is related to the initial electron trapping rate (IETR), which is proportional to pre-existing damage. So far, there has been no comparison of the sensitivity of the different methods or their limitations. So, it is necessary to establish basic understanding of these issues for future industry standards of damage testing. To determine whether the device has been damaged by fabrication charge build-up, manufacturers have incorporated antenna structures into the semiconductor devices. These structures may be employed to test the device and determine whether charge damage has occurred in the device during the fabrication process.

Unfortunately, however, the antenna structure suffers from certain disadvantages. For example, the antenna structure size is typically directly proportional to its damage sensitivity. Therefore, to obtain a reading on a very small charge, a larger antenna ratio (poly/oxide areas) structure is required. In many cases, these larger antenna structures are necessary because the charge damage that often occurs in the device is very small.

Moreover, these antenna structures are unable to isolate the specific device layers that are damaged, when multi-layer chips are involved. Thus, it is not possible to determine what part of the process has caused the charge damage, and due to the complexity of fabrication of the antenna structure, time delays and corresponding overall costs involved, frequent testing during the fabrication process is typically prohibitive.

Accordingly, what is needed in the art is a cost effective way to determine process-induced damage and direct the adjustment of the appropriate process parameters on a frequent basis.

SUMMARY OF THE INVENTION

To address the above-discussed deficiencies of the prior art, the present invention provides a method for controlling a process parameter for fabricating a semiconductor wafer. In one embodiment, the method includes forming a test substrate using a given process parameter, determining a flatband voltage of the test substrate, and modifying the given process parameter to cause the flatband voltage to approach zero. The process parameter that is modified to cause the flatband voltage to approach zero may vary. For example, a deposition pressure used to deposit a dielectric layer, may be modified. Alternatively, the modification may include forming a cap layer on an oxide deposited on the test substrate prior to forming a dielectric layer on the test substrate. Preferably, the flatband is determined by a non-contact method, which uses a kelvin probe to measure the flatband voltage and a corona source to deposit charge on the test substrate.

Thus, one aspect of the present invention provides a non-contact method for easily determining whether a certain fabrication process, such as a dielectric deposition, produces a wafer with charge damage early in the semiconductor devices formation. Additionally, the present invention also provides a method that can readily detect low levels of charge damage that have been previously undetectable. Due to the sensitivity and accuracy of this method and the ease with which it can be conducted, substantial fabrication downtime, which is prevalent in present processes, can be saved, thereby lowering the fabrication costs of the semiconductor device.

In other embodiments, forming, determining and modifying are repeated until the flatband voltage approximates or reaches zero. When the flatband voltage is about zero, charge is either not present in the semiconductor wafer, or is extremely small such that no substantial damage results to the device's operation.

In certain embodiments, forming a test substrate includes forming an oxide layer on a silicon substrate and depositing a dielectric layer on the oxide layer. Yet other embodiments includes determining the flatband voltage with a non-contact method.

In yet another embodiment, the method may further include determining an interface trap density of the test substrate and modifying process parameters to minimize interface trap density.

The foregoing has outlined, rather broadly, preferred and alternative features of the present invention so that those who are skilled in the art may better understand the detailed description of the invention that follows. Additional features of the invention will be described hereinafter that form the subject of the claims of the invention. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
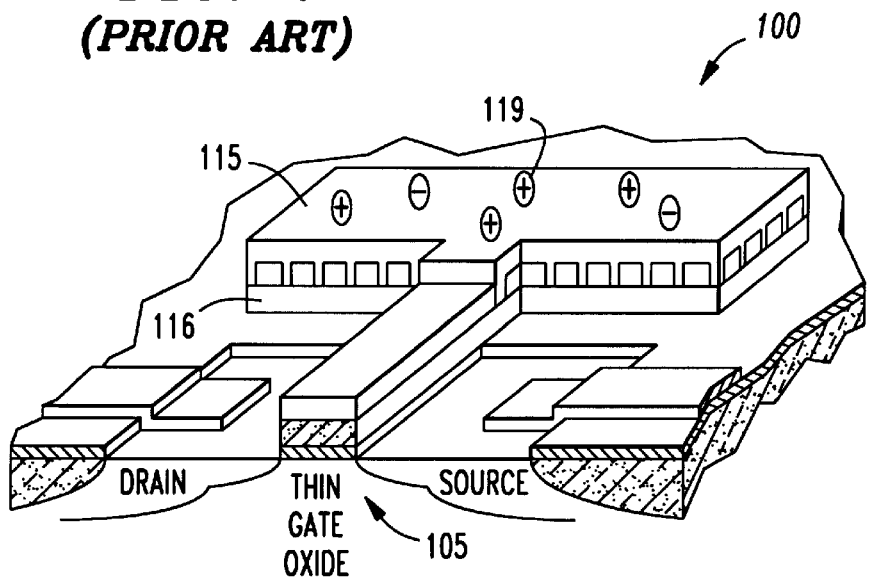
FIG. 1 illustrates a semiconductor device that may be used as a test device in a conventional test method to determine electrical properties.

Referring initially to FIG. 1, illustrated is a semiconductor device 100 that may be used as a test device in a conventional test method to determine electrical properties. The semiconductor device 100 includes a transistor device 105 having a conventional stacked antenna structure 115, which includes a polysilicon antenna 116.

The antenna structure 115 maximizes the charging sensitivity of oxides to fabrication process damage, by increasing the antenna ratio (gate poly area/gate dielectric area) during fabrication process exposure. The resulting collected charge 119 is proportional to the antenna ratio. Typical area ratios of the antenna structure 115 may range from 5000 to 100,000 times the gate area to which it is attached, resulting in increasing charge sensitivity.

Figure 2:
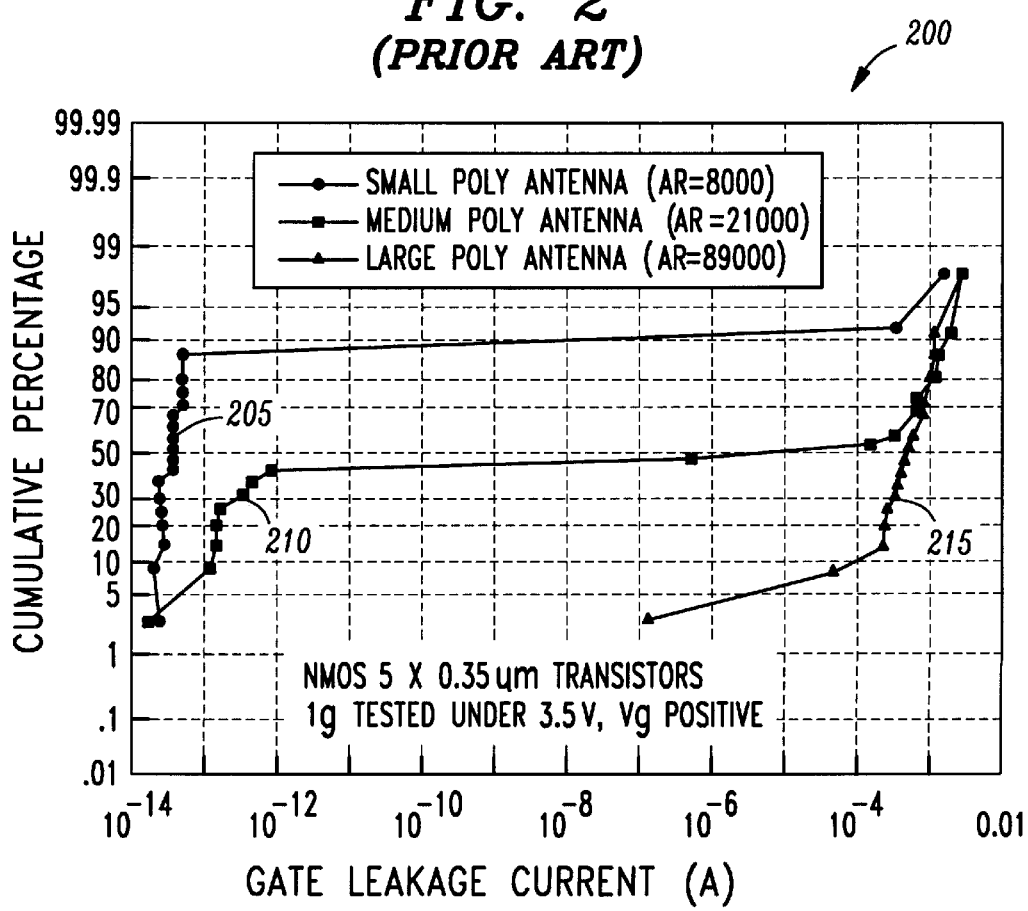
FIG. 2 illustrates a graph showing the electrical properties of the semiconductor device using the conventional test method of FIG. 1.

Turning now to FIG. 2, illustrated is a graph 200 showing the electrical properties of the semiconductor device 100 using the conventional test method of FIG. 1. The graph 200 includes a first electrical characteristic 205, a second electrical characteristic 210 and a third electrical characteristic 215 resulting from the electrical tests employed. The first, second and third electrical characteristics 205, 210, 215 illustrate a gate leakage current for antenna structures having area ratios (AR) of 8,000, 21,000 and 89,000 times their corresponding gate areas, respectively. As discussed earlier, the determination of process damage using this conventional antenna structure is impractical during actual fabrication since use of the method does not allow the charge damage to be isolated for multi-layer devices and is time and cost prohibitive for use between each dielectric layer.

Figure 3:
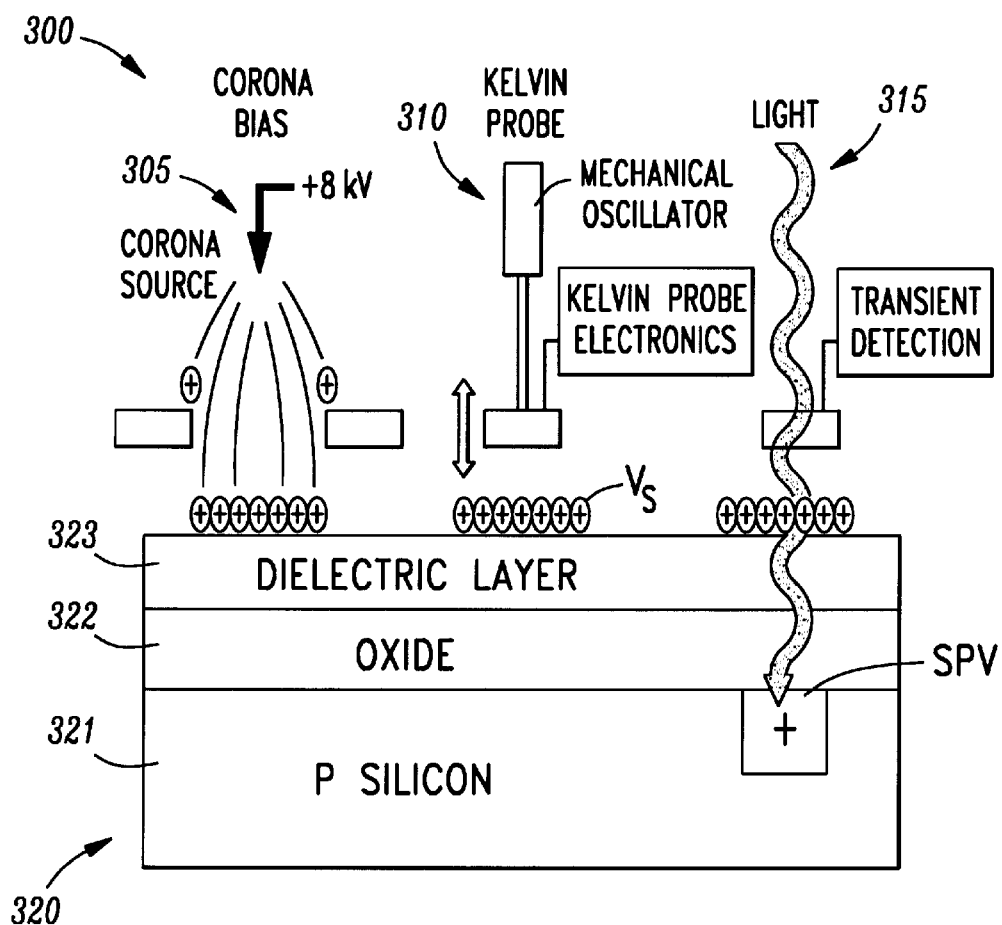
FIG. 3 illustrates a non-contact test method for determining electrical properties of a test substrate according to the principles of the present invention.

Turning now to FIG. 3, illustrated is a non-contact test device 300 for determining electrical properties of a test substrate according to the principles of the present invention. This embodiment includes using a conventional non-contact method that uses a corona source 305, a kelvin probe 310, a light source 315 to form a charge on a test wafer 320, which itself includes a p-type silicon substrate 321, an oxide layer 322 and a dielectric layer 323.

In a conventional manner, the non-contact method initially deposits charge on the exposed top surface of the dielectric layer 323. The light source 315 is then used to bombard the device with photons to generate electron-hole pairs and flatten the energy bands. Electrical measurements, such as surface photovoltage (SPV) and a surface voltage Vs are then acquired, using the Kelvin probe 310. From these electrical measurements, a flatband voltage can be determined. The flatband voltage is defined as the value of this surface voltage Vs when the SPV has a value of zero.

Figure 4:
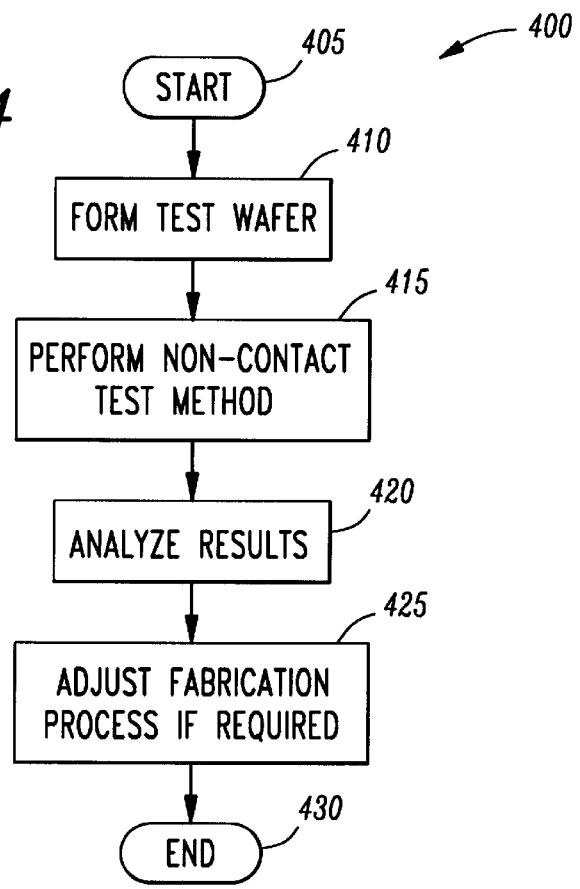
FIG. 4 illustrates a flowchart showing a method of testing the integrity of a semiconductor fabrication process.

Turning now to FIG. 4 with continued reference to the device structure of FIG. 3, illustrated is a flowchart 400 showing a method of testing the integrity of a semiconductor fabrication process. The method illustrated in the flowchart 400 allows determination of whether a certain fabrication process produces a wafer with charge damage before actual semiconductor device formulation begins. The method begins at 405, wherein it is determined that a test semiconductor device needs to be fabricated. Then, the test wafer is formed at 410 using a selection of fabrication process parameters. For example, the parameter to be test may include the deposition parameters used to deposit pre-metal dielectric. In such instances, the dielectric layer 323, using the present deposition parameters, is deposited on the substrate 321 of the test wafer 300. If required, the oxide layer 322 may be thermally formed on the substrate prior to the dielectric deposition to prevent leakage. However, in certain embodiments, the oxide layer 322 may not be present. The oxide layer 322 is typically thermally grown, and the dielectric layer 323 may be deposited using known plasma deposition processes. The non-contact test method 300 of FIG. 3 is then performed at 415 using the test wafer prepared at 410.

Next, the results at 415 are analyzed with a conventional non-contact method at 420 to determine the value of a flatband voltage of the dielectric layer 323 as deposited using the given process parameters. If the flatband voltage is not near or approximately zero, the process deposition parameters are adjusted. A new test wafer is provided and the dielectric layer is deposited using adjusted process parameters, and the method is repeated starting with the step 410.

This method continues, until the process parameters selected result in a test wafer that produces a flatband voltage that is near or approximates zero. This indicates that the process-induced charge build-up is sufficiently low assuring predictable device performance, and the method ends in a step 430. Then, semiconductor fabrication of actual production wafers may be initiated, with high confidence, using these process parameters. The process parameter that is modified to cause the flatband voltage to approach zero may vary. The process parameter may be a deposition pressure, the forming of a cap layer on an oxide or some other parameter. In addition to the determination of the flatband voltage, the method may also include determining an interface trap density of the test substrate 320 that may also be used to repeatedly modify and then test the fabrication process in order to minimize the interface trap density. While a pre-metal dielectric has been discussed, it should be understood that the present method may be used regarding any layer within the semiconductor device.

Figure 5:
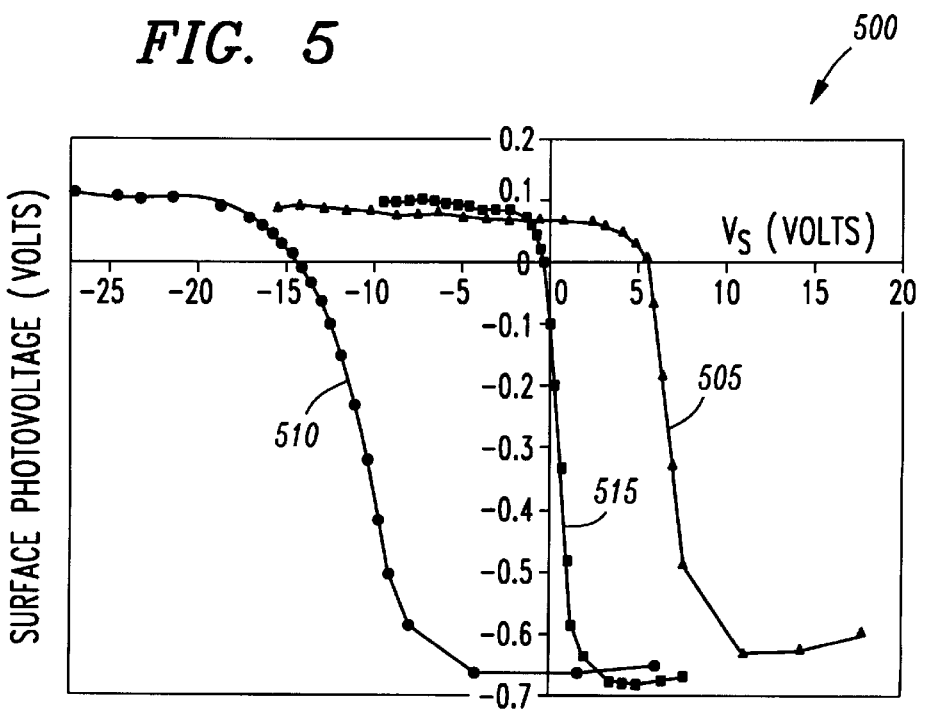
FIG. 5 illustrates is a graph showing the test results for the non-contact test method employed in FIG. 3 and FIG. 4.

Turning now to FIG. 5, illustrated is a graph 500 showing the test results for the non-contact test method 300 employed in FIG. 3 and FIG. 4. The graph 500 includes a first test response curve 505, a second test response curve 510 and a third test response curve 515. Each of the first, second and third test response curves 505, 510, 515 are the results of performing the non-contact method on a test wafer 320 that has been fabricated using a different process or process parameter.

The surface voltage Vs where the SPV equals zero is the value of flatband voltage associated with each of the test response curves. Therefore, the fabrication process that produced the first test response curve 505 is seen to have a flatband voltage of approximately 5 volts. This value indicates that the process-related charge damage is significant enough to affect the device performance and must be adjusted.

Adjustment of the fabrication process resulted in the second test response curve 510, which produced a flatband voltage of approximately −15 volts. This value indicates that the process-related charge damage is also significant, thereby requiring another fabrication process adjustment. The third test response curve 515, obtained after further fabrication process adjustments, indicates a flatband voltage of approximately zero. This result indicates that the fabrication process parameters used to fabricate this test wafer produced minimal charge damage and therefore are acceptable for a production run.

In summary, the present invention provides a method that can readily detect low levels of charge damage that have been previously undetectable. Due to the sensitivity, accuracy and facility of this method, substantial fabrication downtime, which is prevalent in present processes, can be saved thereby lowering the fabrication costs of the semiconductor device.

Although the present invention has been described in detail, those who are skilled in the art should understand that they can make various changes, substitutions and alterations herein without departing from the spirit and scope of the invention in its broadest form.

What is claimed is:

1. A process for fabricating a semiconductor device, comprising;

forming a dielectric on a test substrate using a given process parameter;

determining a flatband voltage of said test substrate using a non-contact method;

modifying said given process parameter to achieve a modified process parameter that causes said flatband voltage to approach zero;

depositing an intermediate level semiconductor substrate over an active device formed on a production semiconductor wafer using said modified process parameter; and connecting said active device to other active devices to form an electronic circuit.

2. The process as recited in claim 1 wherein forming a dielectric layer includes forming a gate oxide layer on said semiconductor wafer.

3. The process as recited in claim 1 wherein determining includes determining a flatband voltage.

* * * * *